US008702938B2

(12) United States Patent
Srinivasan et al.

(10) Patent No.: US 8,702,938 B2
(45) Date of Patent: Apr. 22, 2014

(54) DROPLET ACTUATOR WITH IMPROVED TOP SUBSTRATE

(75) Inventors: Vijay Srinivasan, Durham, NC (US); Michael G. Pollack, Durham, NC (US); Alexander Shenderov, Raleigh, NC (US); Zhishan Hua, Durham, NC (US); Arjun Sudarsan, Cary, NC (US)

(73) Assignee: Advanced Liquid Logic, Inc., Morrisville, NC (US)

( * ) Notice: Subject to any disclaimer, the term of this patent is extended or adjusted under 35 U.S.C. 154(b) by 447 days.

(21) Appl. No.: 12/676,384

(22) PCT Filed: Sep. 4, 2008

(86) PCT No.: PCT/US2008/075160
§ 371 (c)(1),
(2), (4) Date: Jul. 9, 2010

(87) PCT Pub. No.: WO2009/032863
PCT Pub. Date: Mar. 12, 2009

(65) Prior Publication Data

US 2010/0282608 A1 Nov. 11, 2010

Related U.S. Application Data

(60) Provisional application No. 60/969,757, filed on Sep. 4, 2007, provisional application No. 60/980,785, filed on Oct. 18, 2007.

(51) Int. Cl.
*G01N 27/26* (2006.01)
*B01L 3/00* (2006.01)
*B81B 7/00* (2006.01)
*F04B 19/00* (2006.01)

(52) U.S. Cl.
USPC ........... 204/450; 204/600; 422/504; 422/68.1

(58) Field of Classification Search
USPC ............... 204/450, 600; 422/504, 68.1, 82.01
See application file for complete search history.

(56) References Cited

U.S. PATENT DOCUMENTS 4,636,785 A 1/1987 Le Pesant
5,122,871 A * 6/1992 Israeli et al. .................. 358/515
5,181,016 A 1/1993 Lee et al.

(Continued)

FOREIGN PATENT DOCUMENTS

WO 0069565 A1 11/2000
WO 0073655 A1 12/2000

(Continued)

OTHER PUBLICATIONS

Esco (Properties of Pyrex, pp. 1-2, downloaded Jun. 26, 2012).*

(Continued)

*Primary Examiner* — Jennifer Dieterle
(74) *Attorney, Agent, or Firm* — William A. Barrett

(57) ABSTRACT

The invention provides a droplet actuator comprising a base substrate and a top substrate separated to form a gap, wherein: (a) the base substrate comprises electrodes configured for conducting droplet operations in the gap; and (b) the top substrate comprises a first portion coupled to second portion, where the second portion comprises one or more openings establishing a fluid path extending from an exterior of the droplet actuator and into the gap. The invention also provides related methods of manufacturing the droplet actuator, methods of using the droplet actuator, and methods of loading the droplet actuator.

24 Claims, 7 Drawing Sheets

(56) References Cited

Figure 1:
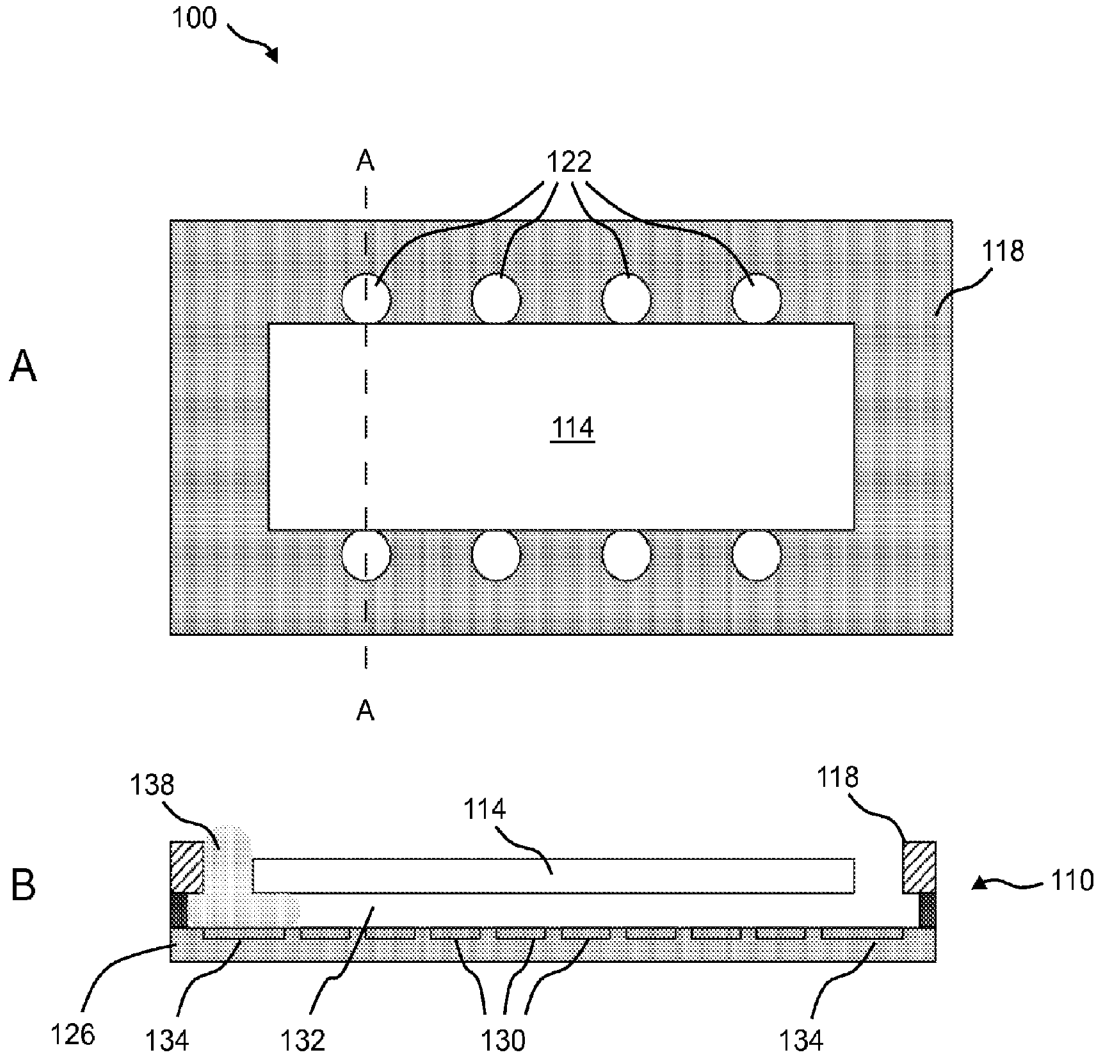

U.S. PATENT DOCUMENTS 5,486,337 A 1/1996 Ohkawa et al.
6,130,098 A 10/2000 Handique et al.
6,294,063 B1 9/2001 Becker et al.
6,396,371 B2 5/2002 Streeter et al.
6,454,924 B2 9/2002 Jedrzejewski
6,565,727 B1 5/2003 Shenderov
6,773,566 B2 8/2004 Shenderov
6,790,011 B1 9/2004 Le Pesant et al.
6,911,132 B2 6/2005 Pamula et al.
6,924,792 B1 8/2005 Jessop
6,977,033 B2 12/2005 Becker et al.
6,989,234 B2 1/2006 Kolar et al.
7,052,244 B2 5/2006 Fouillet et al.
7,163,612 B2 1/2007 Sterling et al.
7,211,223 B2 5/2007 Fouillet et al.
7,255,780 B2 8/2007 Shenderov
7,328,979 B2 2/2008 Decre et al.
7,329,545 B2 2/2008 Pamula et al.
7,439,014 B2 10/2008 Pamula et al.
7,458,661 B2 12/2008 Kim et al.
7,531,072 B2 5/2009 Roux et al.
7,547,380 B2 6/2009 Velev
7,569,129 B2 8/2009 Pamula et al.
7,641,779 B2 1/2010 Becker et al.
7,727,466 B2 6/2010 Meathrel et al.
7,727,723 B2 6/2010 Pollack et al.
7,759,132 B2 7/2010 Pollack et al.
7,763,471 B2 7/2010 Pamula et al.
7,815,871 B2 10/2010 Pamula et al.
7,816,121 B2 10/2010 Pollack et al.
7,822,510 B2 10/2010 Paik et al.
7,851,184 B2 12/2010 Pollack et al.
7,875,160 B2 1/2011 Jary
7,901,947 B2 3/2011 Pollack et al.
7,919,330 B2 4/2011 De Guzman et al.
7,922,886 B2 4/2011 Fouillet et al.
7,939,021 B2 5/2011 Smith et al.
7,943,030 B2 5/2011 Shenderov
7,989,056 B2 8/2011 Plissonnier et al.
7,998,436 B2 8/2011 Pollack
8,007,739 B2 8/2011 Pollack et al.
8,041,463 B2 10/2011 Pollack et al.
8,048,628 B2 11/2011 Pollack et al.
8,075,754 B2 12/2011 Sauter-Starace et al.
8,088,578 B2 1/2012 Hua et al.
8,093,064 B2 1/2012 Shah et al.
8,137,917 B2 3/2012 Pollack et al.
8,147,668 B2 4/2012 Pollack et al.
8,202,686 B2 6/2012 Pamula et al.
8,208,146 B2 6/2012 Srinivasan et al.
8,221,605 B2 7/2012 Pollack et al.
8,236,156 B2 8/2012 Sarrut et al.
8,268,246 B2 9/2012 Srinivasan et al.
8,287,711 B2 10/2012 Pollack et al.
8,304,253 B2 11/2012 Yi et al.
8,317,990 B2 11/2012 Pamula et al.
8,342,207 B2 1/2013 Raccurt et al.
8,349,276 B2 1/2013 Pamula et al.
8,364,315 B2 1/2013 Sturmer et al.
8,388,909 B2 3/2013 Pollack et al.
8,389,297 B2 3/2013 Pamula et al.
8,394,249 B2 3/2013 Pollack et al.
8,426,213 B2 4/2013 Eckhardt et al.
8,440,392 B2 5/2013 Pamula et al.
8,444,836 B2 5/2013 Fouillet et al.
2002/0005354 A1 1/2002 Spence et al.
2002/0036139 A1 3/2002 Becker et al.
2002/0039797 A1* 4/2002 Bonde et al. .................. 436/518
2002/0043463 A1 4/2002 Shenderov
2002/0058332 A1 5/2002 Quake et al.
2002/0143437 A1 10/2002 Handique et al.
2003/0164295 A1 9/2003 Sterling
2003/0183525 A1 10/2003 Elrod et al.
2003/0205632 A1 11/2003 Kim et al.
2004/0031688 A1 2/2004 Shenderov
2004/0055891 A1 3/2004 Pamula et al.
2004/0058450 A1 3/2004 Pamula et al.
2004/0211659 A1* 10/2004 Velev ............................ 204/164
2004/0231987 A1 11/2004 Sterling et al.
2005/0175505 A1* 8/2005 Cantor et al. ................ 422/68.1
2005/0279635 A1* 12/2005 Chow et al. ................... 204/601
2006/0021875 A1 2/2006 Griffith et al.
2006/0054503 A1 3/2006 Pamula et al.
2006/0102477 A1* 5/2006 Vann et al. .................... 204/450
2006/0164490 A1 7/2006 Kim et al.
2006/0194331 A1 8/2006 Pamula et al.
2006/0231398 A1* 10/2006 Sarrut et al. .................. 204/450
2007/0023292 A1* 2/2007 Kim et al. ..................... 204/643
2007/0037294 A1 2/2007 Pamula et al.
2007/0045117 A1 3/2007 Pamula et al.
2007/0064990 A1 3/2007 Roth
2007/0086927 A1 4/2007 Natarajan et al.
2007/0138016 A1* 6/2007 Wang ............................ 204/600
2007/0207513 A1 9/2007 Sorensen et al.
2007/0217956 A1 9/2007 Pamula et al.
2007/0241068 A1 10/2007 Pamula et al.
2007/0242105 A1 10/2007 Srinivasan et al.
2007/0242111 A1 10/2007 Pamula et al.
2007/0243634 A1 10/2007 Pamula et al.
2007/0267294 A1 11/2007 Shenderov
2007/0275415 A1 11/2007 Srinivasan et al.
2008/0006535 A1 1/2008 Paik et al.
2008/0038810 A1 2/2008 Pollack et al.
2008/0044893 A1 2/2008 Pollack et al.
2008/0044914 A1 2/2008 Pamula et al.
2008/0050834 A1 2/2008 Pamula et al.
2008/0053205 A1 3/2008 Pollack et al.
2008/0105549 A1 5/2008 Pamela et al.
2008/0124252 A1 5/2008 Marchand et al.
2008/0142376 A1 6/2008 Fouillet et al.
2008/0151240 A1 6/2008 Roth
2008/0210558 A1 9/2008 Sauter-Starace et al.
2008/0247920 A1 10/2008 Pollack et al.
2008/0264797 A1 10/2008 Pamula et al.
2008/0274513 A1 11/2008 Shenderov et al.
2008/0281471 A1 11/2008 Smith et al.
2008/0283414 A1 11/2008 Monroe et al.
2008/0302431 A1 12/2008 Marchand et al.
2008/0305481 A1 12/2008 Whitman et al.
2009/0014394 A1 1/2009 Yi et al.
2009/0042319 A1 2/2009 De Guzman et al.
2009/0127123 A1 5/2009 Raccurt et al.
2009/0134027 A1 5/2009 Jary
2009/0142564 A1 6/2009 Plissonnier et al.
2009/0155902 A1 6/2009 Pollack et al.
2009/0192044 A1 7/2009 Fouillet
2009/0260988 A1 10/2009 Pamula et al.
2009/0263834 A1 10/2009 Sista et al.
2009/0280251 A1 11/2009 De Guzman et al.
2009/0280475 A1 11/2009 Pollack et al.
2009/0280476 A1 11/2009 Srinivasan et al.
2009/0283407 A1 11/2009 Shah et al.
2009/0288710 A1 11/2009 Viovy et al.
2009/0291433 A1 11/2009 Pollack et al.
2009/0304944 A1 12/2009 Sudarsan et al.
2009/0311713 A1 12/2009 Pollack et al.
2009/0321262 A1 12/2009 Adachi et al.
2010/0025242 A1 2/2010 Pamula et al.
2010/0025250 A1 2/2010 Pamula et al.
2010/0028920 A1 2/2010 Eckhardt
2010/0032293 A1 2/2010 Pollack et al.
2010/0041086 A1 2/2010 Pamula et al.
2010/0048410 A1 2/2010 Shenderov et al.
2010/0062508 A1 3/2010 Pamula et al.
2010/0068764 A1 3/2010 Sista et al.
2010/0087012 A1 4/2010 Shenderov
2010/0096266 A1 4/2010 Kim et al.
2010/0116640 A1 5/2010 Pamula et al.
2010/0118307 A1 5/2010 Srinivasan et al.
2010/0120130 A1 5/2010 Srinivasan et al.
2010/0126860 A1 5/2010 Srinivasan et al.
2010/0130369 A1 5/2010 Shenderov et al.
2010/0140093 A1 6/2010 Pamula et al.
2010/0143963 A1 6/2010 Pollack

(56) References Cited

U.S. PATENT DOCUMENTS

| | | | |
|---|---|---|---|
| 2010/0151439 A1 | 6/2010 | Pamula et al. |
| 2010/0190263 A1 | 7/2010 | Srinivasan et al. |
| 2010/0221713 A1 | 9/2010 | Pollack et al. |
| 2010/0320088 A1 | 12/2010 | Fouillet et al. |
| 2010/0323405 A1 | 12/2010 | Pollack et al. |
| 2011/0076692 A1 | 3/2011 | Sista et al. |
| 2011/0104816 A1 | 5/2011 | Pollack et al. |
| 2011/0213499 A1 | 9/2011 | Sturmer et al. |
| 2012/0165238 A1 | 6/2012 | Pamula et al. |

FOREIGN PATENT DOCUMENTS

| | | |
|---|---|---|
| WO | 2004029585 A1 | 4/2004 |
| WO | 2004030820 | 4/2004 |
| WO | 2005047696 A1 | 5/2005 |
| WO | 2006013303 A1 | 2/2006 |
| WO | 2006070162 A1 | 7/2006 |
| WO | 2006081558 | 8/2006 |
| WO | 2006124458 A2 | 11/2006 |
| WO | 2006127451 A2 | 11/2006 |
| WO | 2006134307 A1 | 12/2006 |
| WO | 2006138543 | 12/2006 |
| WO | 2007003720 A1 | 1/2007 |
| WO | 2007012638 A1 | 2/2007 |
| WO | 2007033990 A1 | 3/2007 |
| WO | 2007048111 | 4/2007 |
| WO | 2007120240 A2 | 10/2007 |
| WO | 2007120241 A2 | 10/2007 |
| WO | 2007123908 A2 | 11/2007 |
| WO | 2008051310 A2 | 5/2008 |
| WO | 2008055256 A3 | 5/2008 |
| WO | 2008068229 A1 | 6/2008 |
| WO | 2008091848 A2 | 7/2008 |
| WO | 2008098236 A2 | 8/2008 |
| WO | 2008101194 A2 | 8/2008 |
| WO | 2008106678 A1 | 9/2008 |
| WO | 2008109664 A1 | 9/2008 |
| WO | 2008112856 A1 | 9/2008 |
| WO | 2008116209 A1 | 9/2008 |
| WO | 2008116221 A1 | 9/2008 |
| WO | 2008118831 A2 | 10/2008 |
| WO | 2008124846 A2 | 10/2008 |
| WO | 2008131420 A2 | 10/2008 |
| WO | 2008134153 A1 | 11/2008 |
| WO | 2009002920 A1 | 12/2008 |
| WO | 2009003184 A1 | 12/2008 |
| WO | 2009011952 A1 | 1/2009 |
| WO | 2009021173 A1 | 2/2009 |
| WO | 2009021233 A2 | 2/2009 |
| WO | 2009026339 A2 | 2/2009 |
| WO | 2009029561 A2 | 3/2009 |
| WO | 2009032863 A2 | 3/2009 |
| WO | 2009052095 A1 | 4/2009 |
| WO | 2009052123 A2 | 4/2009 |
| WO | 2009052321 A2 | 4/2009 |
| WO | 2009052345 | 4/2009 |
| WO | 2009052348 A2 | 4/2009 |
| WO | 2009076414 | 6/2009 |
| WO | 2009086403 A2 | 7/2009 |
| WO | 2009111769 A2 | 9/2009 |
| WO | 2009135205 A2 | 11/2009 |
| WO | 2009137415 A2 | 11/2009 |
| WO | 2009140373 A2 | 11/2009 |
| WO | 2009140671 A2 | 11/2009 |
| WO | 2010004014 A1 | 1/2010 |
| WO | 2010006166 A2 | 1/2010 |
| WO | 2010009463 A2 | 1/2010 |
| WO | 2010019782 A2 | 2/2010 |
| WO | 2010027894 A3 | 3/2010 |
| WO | 2010042637 A2 | 4/2010 |
| WO | 2010077859 A3 | 7/2010 |

OTHER PUBLICATIONS

"The Notes for Polymer and Coatings Science" (1995, pp. 1-7).*

Hoose (Mini Lathe Materials, 2000).*

Dambrot (http://Physics.org.news/2011-05; Smooth operators: Teflon microfluidic chips).*

H. Ren, R.B. Fair, and M.G. Pollack, "Automated on-chip droplet dispensing with volume control by electro-wetting actuation and capacitance metering" Sensors and Actuators B, 98, pp. 319-327, 2004.

Chakrabarty, "Automated Design of Microfluidics-Based Biochips: connecting Biochemistry of Electronics CAD", IEEE International Conference on Computer Design, San Jose, CA, Oct. 1-4, 2006, 93-100.

Chakrabarty, et al., "Design Automation Challenges for Microfluidics-Based Biochips", DTIP of MEMS & MOEMS, Montreux, Switzerland, Jun. 1-3, 2005.

Chakrabarty, et al., "Design Automation for Microfluidics-Based Biochips", ACM Journal on Engineering Technologies in Computing Systems, 1(3), 2005, 186-223.

Chakrabarty, K, "Design, Testing, and Applications of Digital Microfluidics-Based.Biochips", Proceedings of the 18th International Conf. on VLSI held jointly with 4th International Conf. on Embedded Systems Design (VLSID'05), IEEE, 2005.

Cotten, et al., "Digital Microfluidics: a novel platform for multiplexed detection of lysosomal storage diseases", Pediatric Academic Society Conference, 2008.

Delattre, Movie in news on TF1 (at 12'45" Cyril Delattre), http://videos.tf1.fr/jt-we/zoom-sur-grenoble-6071525.html, 2009.

Delattre, Movie in talk show "C Dans l'air" (at 24" Cyril Delattre), http://www.france5.fr/c-dans-l-air/sante/bientot-vous-ne-serez-plus-malade-31721, 2009.

Delattre, Movie on Web TV—Cite des sciences (at 3'26" Cyril DELATTRE), http://www.universcience.tv/video-laboratoire-de-poche-793.html, 2009.

Delattre, et al., "Towards an industrial fabrication process for electrowetting chip using standard MEMS Technology", μTAS2008, San Diego; poster presented, Oct. 15, 2008.

Delattre, et al., "Towards an industrial fabrication process for electrowetting chip using standard MEMS Technology", μTAS2008, San Diego; Abstract in proceedings, Oct. 13-16, 2008, 1696-1698.

Dewey, "Towards a Visual Modeling Approach to Designing Microelectromechanical System Transducers", Journal of Micromechanics and Microengineering, vol. 9, Dec. 1999, 332-340.

Dewey, et al., "Visual modeling and design of microelectromechanical system tansducers", Microelectronics Journal, vol. 32, Apr. 2001, 373-381.

Emani, et al., "Novel Microfluidic Platform for Point of Care Hypercoagulability Panel Testing", Circulation, vol. 122, 2010, A14693.

Fair, et al., "A Micro-Watt Metal-Insulator-Solution-Transport (MIST) Device for Scalable Digital Bio-Microfluidic Systems", IEEE IEDM Technical Digest, 2001, 16.4.1-4.

Fair, et al., "Bead-Based and Solution-Based Assays Performed on a Digital Microfluidic Platform", Biomedical Engineering Society (BMES) Fall Meeting, Baltimore, MD, Oct. 1, 2005.

Fair, "Biomedical Applications of Electrowetting Systems", 5th International Electrowetting Workshop, Rochester, NY, 2006.

Fair, et al., "Chemical and Biological Applications of Digital-Microfluidic Devices", IEEE Design & Test of Computers, vol. 24(1), Jan.-Feb. 2007, 10-24.

Fair, "Digital microfluidics: is a true lab-on-a-chip possible?", Microfluid Nanofluid, vol. 3, 2007, 245-281.

Fair, et al., "Electrowetting-based On-Chip Sample Processing for Integrated Microfluidics", IEEE Inter. Electron Devices Meeting (IEDM), 2003, 32.5.1-32.5.4.

Fair, et al., "Integrated chemical/biochemical sample collection, pre-concentration, and analysis on a digital microfluidic lab-on-a-chip platform", Lab-on-a-Chip: Platforms, Devices, and Applications, Conf. 5591, SPIE Optics East, Philadelphia, Oct. 25-28, 2004.

Fair, "Scaling of Digital Microfluidic Devices for Picoliter Applications", The 6th International Electrowetting Meeting, Aug. 20-22, 2008.

(56) References Cited

OTHER PUBLICATIONS

Fouillet, "Bio-Protocol Integration in Digital Microfluidic Chips", The 6th International Electrowetting Meeting, Aug. 20-22, 2008.
Fouillet, et al., "Design and Validation of a Complex Generic Fluidic Microprocessor Based on EWOD Droplet for Biological Applications", 9th International Conference on Miniaturized Systems for Chem and Life Sciences, Boston, MA, Oct. 9-13, 2005, 58-60.
Fouillet, et al., "Digital microfluidic design and optimization of classic and new fluidic functions for lab on a chip systems", Microfluid Nanofluid, vol. 4, 2008, 159-165.
Hua, et al., "Multiplexed real-time polymerase chain reaction on a digital microfluidic platform", Analytical Chemistry, vol. 82, No. 6, Mar. 15, 2010, Published on Web, Feb. 12, 2010, 2310-2316.
Hua, et al., "Rapid Detection Of Methicillin-Resistant *Staphylococcus Aureus* (MRSA) Using Digital Microfluidics", Proc. µTAS, 2008.
Jary, et al., "SmartDrop, Microfluidics for Biology", Forum 4i 2009, Grenoble, France; Flyer distributed at booth, May 14, 2009.
Kleinert, et al., "Electric Field-Assisted Convective Assembly of Large-Domain Colloidal Crystals", The 82nd Colloid & Surface Science Symposium, ACS Division of Colloid & Surface Science, North Carolina State University, Raleigh, NC. www.colloids2008.org., Jun. 15-18, 2008.
Kleinert, "Electric-Field-Assisted Convective Assembly of Colloidal Crystal Coatings", Langmuir, vol. 26(12), 2010, 10380-10385.
Malk, R. et al., "EWOD in coplanar electrode configurations", Proceedings of ASME 2010 3rd Joint US-European Fluids Engineering Summer Meeting and 8th International Conference on Nanochannels, Microchannels, and Minichannels, http://asmedl.org/getabs/servlet/GetabsServlet?prog=normal&id=ASMECP002010054501000239000001, 2010.
Marchand, et al., "Organic Synthesis in Soft Wall-Free Microreactors: Real-Time Monitoring of Fluorogenic Reactions", Analytical Chemistry, vol. 80, 2008, 6051-6055.
Millington, et al., "Digital Microfluidics: a novel platform for multiplexed detection of LSDs with potential for newborn screening", Association of Public Health Laboratories Annual Conference, San Antonio, TX, Nov. 4, 2008.
Millington, et al., "Digital Microfluidics: A Novel Platform For Multiplexing Assays Used In Newborn Screening", Proceedings of the 7th International and Latin American Congress. Oral Presentations. Rev Invest Clin; vol. 61 (Supl. 1), 2009, 21-33.
Paik, et al., "A digital-microfluidic approach to chip cooling", IEEE Design & Test of Computers, vol. 25, Jul. 2008, 372-381.
Paik, et al., "Active cooling techniques for integrated circuits", IEEE Transactions on VLSI, vol. 16, No. 4, 2008, 432-443.
Paik, et al., "Adaptive Cooling of Integrated Circuits Using Digital Microfluidics", accepted for publication in IEEE Transactions on VLSI Systems, 2007, and Artech House, Norwood, MA, 2007.
Paik"Adaptive Hot-Spot Cooling of Integrated Circuits Using Digital Microfluidics", Dissertation, Dept. of Electrical and Computer Engineering, Duke University, Apr. 25, 2006, 1-188.
Paik et al., "Adaptive hot-spot cooling of integrated circuits using digital microfluidics", Proceedings ASME International Mechanical Engineering Congress and Exposition, Orlando, Florida, USA. IMECE2005-81081, Nov. 5-11, 2005, 1-6.
Paik, et al., "Coplanar Digital Microfluidics Using Standard Printed Circuit Board Processes", 9th Int'l Conf. on Miniaturized Systems for Chemistry and Life Sciences, Boston, MA, Oct. 9-13, 2005, 566-68.
Paik, et al., "Droplet-Based Hot Spot Cooling Using Topless Digital Microfluidics on a Printed Circuit Board", Int'l Workshops on Thermal Investigations of ICs and Systems (THERMINIC), 2005, 278-83.
Paik, et al., "Electrowetting-based droplet mixers for microfluidic systems", Lab on a Chip (LOC), vol. 3. (more mixing videos available, along with the article, at LOC's website), 2003, 28-33.
Paik, et al., "Programmable Flow-Through Real Time PCR Using Digital Microfluidics", 11th International Conference on Miniaturized Systems for Chemistry and Life Sciences, Paris, France, Oct. 7-11, 2007, 1559-1561.
Paik, et al., "Rapid Droplet Mixers for Digital Microfluidic Systems", Masters Thesis, Duke Graduate School., 2002, 1-82.
Paik, et al., "Rapid droplet mixers for digital microfluidic systems", Lab on a Chip, vol. 3. (More mixing videos available, along with the article, at LOC's website.), 2003, 253-259.
Paik, et al., "Thermal effects on Droplet Transport in Digital Microfluids with Application to Chip Cooling Processing for Integrated Microfluidics", International Conference on Thermal, Mechanics, and Thermomechanical Phenomena in Electronic Systems (ITherm), 2004, 649-654.
Pamula, et al., "A droplet-based lab-on-a-chip for colorimetric detection of nitroaromatic explosives", Proceedings of Micro Electro Mechanical Systems, 2005, 722-725.
Pamula, et al., "Cooling of integrated circuits using droplet-based microfluidics", Proc. ACM Great Lakes Symposium on VLSI, Apr. 2003, 84-87.
Pamula, "Digital microfluidic lab-on-a-chip for multiplexing tests in newborn screening", Newborn Screening Summit: Envisioning a Future for Newborn Screening, Bethesda, MD, Dec. 7, 2009.
Pamula, et al., "Digital microfluidic lab-on-a-chip for protein crystallization", 5th Protein Structure Initiative "Bottlenecks" Workshop, NIH, Bethesda, MD, Apr. 13-14, 2006, I-16.
Pamula, et al., "Digital Microfluidic Methods in Diagnosis of Neonatal Biochemical Abnormalities", Developing Safe and Effective Devices and Instruments for Use in the Neonatal Intensive Care for the 21st Century, Pediatric Academic Societies' Annual Meeting, Vancouver, Canada, 2010.
Pamula, et al., "Microfluidic electrowetting-based droplet mixing", Proceedings, MEMS Conference Berkeley, Aug. 24-26, 2001, 8-10.
Pamula, "Sample Preparation and Processing using Magnetic Beads on a Digital Microfluidic Platform", CHI's Genomic Sample Prep, San Francisco, CA, Jun. 9-10, 2009.
Pamula, "Sample-to-sequence-molecular diagnostics on a digital microfluidic lab on a chip", Pre-conference workshops, 4th International Conference on Birth Defects and Disabilities in the Developing World, New Dehli, India, Oct. 4, 2009.
Pollack, et al., "Electrowetting-Based Actuation of Droplets for Integrated Microfluidics", Lab on a Chip (LOC), vol. 2, 2002, 96-101.
Pollack, et al., "Electrowetting-based actuation of liquid droplets for microfluidic applications", Appl. Phys. Letters, vol. 77, No. 11, Sep. 11, 2000, 1725-1726.
Pollack, "Electrowetting-based Microactuation of Droplets for Digital Microfluidics", PhD Thesis, Department of Electrical and Computer Engineering, Duke University, 2001.
Pollack, et al., "Electrowetting-Based Microfluidics for High—Throughput Screening", smallTalk 2001 Conference Program Abstract, San Diego, Aug. 27-31, 2001, 149.
Pollack, "Lab-on-a-chip platform based digital microfluidics", The 6th International Electrowetting Meeting, Aug. 20-22, 2008.
Ren, et al., "Automated electrowetting-based droplet dispensing with good reproducibility", Proc. Micro Total Analysis Systems (mTAS), 7th Int. Conf. on Miniaturized Chem and Biochem Analysis Systems, Squaw Valley, CA, Oct. 5-9, 2003, 993-996.
Ren, et al., "Design and testing of an interpolating mixing architecture for electrowetting-based droplet-on-chip chemical dilution", Transducers, 12th International Conference on Solid—State Sensors, Actuators and Microsystems, 2003, 619-622.
Ren, et al., "Dynamics of electro-wetting droplet transport", Sensors and Actuators B (Chemical), vol. B87, No. 1, Nov. 15, 2002, 201-206.
Ren, et al., "Micro/Nana Liter Droplet Formation and Dispensing by Capacitance Metering and Electrowetting Actuation", IEEE-NANO, 2002, 369-372.
Rival, et al., "EWOD Digital Microfluidic Device for Single Cells Sample Preparation and Gene Expression Analysis", Lab Automation 2010, Palm Springs Convention Center, Palm Springs, CA, USA; Abstract in Proceedings, Poster distributed at conference, Jan. 23-27, 2010.
Rival, et al., "Expression de genes de quelques cellules sur puce EWOD/Gene expression of few cells on EWOD chip", iRTSV, http://www-dsv.cea.fr/var/plain/storage/original/media/File/iRTSV/thema_08(2).pdf (english translation), Winter 2009-2010.

(56) References Cited

OTHER PUBLICATIONS

Rival, et al., "Towards Single Cells Gene Expression on EWOD Lab On Chip", ESONN 2008, Grenoble, France; Poster presented, Aug. 26, 2008.
Rival, et al., "Towards single cells gene expression preparation and analysis on ewod lab on chip", Nanobio Europe 2009, Poster distributed at conference, Jun. 16-18, 2009.
Rival, et al., "Towards single cells gene expression preparation and analysis on ewod lab on chip", Lab On Chip Europe 2009 poster distributed at Conference, May 19-20, 2009.
Rouse, et al., "Digital microfluidics: a novel platform for multiplexing assays used in newborn screening", Poster 47, 41st AACC's Annual Oak Ridge Conference Abstracts, Clinical Chemistry, vol. 55, 2009, 1891.
Sista, et al., "96-Immunoassay Digital Microfluidic Multiwell Plate", Proc. μTAS, 2008.
Sista, "Development of a Digital Microfluidic Lab-on-a-Chip for Automated Immunoassays with Magnetically Responsive Beads", PhD Thesis, Department of Chemical Engineering, Florida State University, 2007.
Sista, et al., "Development of a digital microfluidic platform for point of care testing", Lab on a chip, vol. 8, Dec. 2008, First published as an Advance Article on the web, Nov. 5, 2008, 2091-2104.
Sista, et al., "Digital Microfluidic platform for multiplexing LSD assays in newborn screening", APHL Newborn Screening and Genetic Testing Symposium, Orlando, 2010.
Sista, et al., "Heterogeneous immunoassays using magnetic beads on a digital microfluidic platform", Lab on a Chip, vol. 8, Dec. 2008, First published as an Advance Article on the web, Oct. 14, 2008, 2188-2196.
Srinivasan, et al., "3-D imaging of moving droplets for microfluidics using optical coherence tomography", Proc. 7th International Conference on Micro Total Analysis Systems (μTAS), Squaw Valley, CA, Oct. 5-9, 2003, 1303-1306.
Srinivasan, et al., "A digital microfluidic biosensor for multianalyte detection", Proc. IEEE 16th Annual Intl Conf. on Micro Electro Mechanical Systems Conference, 2003, 327-330.
Srinivasan, "A Digital Microfluidic Lab-on-a-Chip for Clinical Diagnostic Applications", Ph.D. thesis, Dept of Electrical and Computer Engineering, Duke University, 2005.
Srinivasan, et al., "An integrated digital microfluidic lab-on-a-chip for clinical diagnostics on human physiological fluids", Lab on a Chip, vol. 4, 2004, 310-315.
Srinivasan, et al., "Clinical diagnostics on human whole blood, plasma, serum, urine, saliva, sweat and tears on a digital microfluidic platform", Proc. 7th International Conference on Micro Total Analysis Systems (μTAS), Squaw Valley, CA, Oct. 5-9, 2003, 1287-1290.
Srinivasan, et al., "Digital Microfluidic Lab-on-a-Chip for Protein Crystallization", The 82nd ACS Colloid and Surface Science Symposium, 2008.
Srinivasan, et al., "Digital Microfluidics: a novel platform for multiplexed detection of lysosomal storage diseases for newborn screening", AACC Oak Ridge Conference Abstracts, Clinical Chemistry, vol. 54, 2008, 1934.
Srinivasan, et al., "Droplet-based microfluidic lab-on-a-chip for glucose detection", Analytica Chimica Acta, vol. 507, No. 1, 2004, 145-150.
Srinivasan, et al., "Electrowetting", Chapter 5, Methods in Bioengineering: Biomicrofabrication and Biomicrofluidics, Ed. J.D. Zahn, ISBN: 9781596934009, Artech House Publishers, 2010.
Srinivasan, et al., "Low cost digital microfluidic platform for protein crystallization", Enabling Technologies for Structural Biology, NIGMS Workshop, Bethesda, MD., Mar. 4-6, 2009, J-23.
Srinivasan, et al., "Protein Stamping for MALDI Mass Spectrometry Using an Electrowetting-based Microfluidic Platform", Lab-on-a-Chip: Platforms, Devices, and Applications, Conf. 5591, SPIE Optics East, Philadelphia, Oct. 25-28, 2004.
Su, et al., "Yield Enhancement of Digital Microfluidics-Based Biochips Using Space Redundancy and Local Reconfiguration", Proc. Design, Automation and Test in Europe (DATE) Conf., IEEE, 2005, 1196-1201.
Sudarsan, et al., "Printed circuit technology for fabrication of plastic based microfluidic devices", Analytical Chemistry vol. 76, No. 11, Jun. 1, 2004, Previously published on-line, May 2004, 3229-3235.
Thwar, et al., "DNA sequencing using digital microfluidics", Poster 42, 41st AACC's Annual Oak Ridge Conference Abstracts, Clinical Chemistry vol. 55, 2009, 1891.
Wang, et al., "Droplet-based micro oscillating-flow PCR chip", J. Micromechanics and Microengineering, vol. 15, 2005, 1369-1377.
Wang, et al., "Efficient in-droplet separation of magnetic particles for digital microfluidics", Journal of Micromechanics and Microengineering, vol. 17, 2007, 2148-2156.
Wulff-Burchfield, et al., "Microfluidic platform versus conventional real-time polymerase chain reaction for the detection of *Mycoplasma pneumoniae* in respiratory specimens", Diagnostic Microbiology and Infectious Disease, vol. 67, 2010, 22-29.
Xu, et al., "A Cross-Referencing-Based Droplet Manipulation Method for High-Throughput and Pin-Constrained Digital Microfluidic Arrays", Proceedings of conference on Design, Automation and Test in Europe (DATE), Apr. 2007.
Xu, et al., "Automated Design of Pin-Constrained Digital Microfluidic Biochips Under Droplet-Interference Constraints", ACM Journal on Emerging Technologies is Computing Systems, vol. 3(3), 2007, 14:1-14:23.
Xu, et al., "Automated, Accurate and Inexpensive Solution-Preparation on a Digital Microfluidic Biochip", Proc. IEEE Biomedical Circuits and Systems Conference (BioCAS), 2008, 301-304.
Xu, et al., "Defect-Aware Synthesis of Droplet-Based Microfluidic Biochips", IEEE, 20th International Conference on VLSI Design, 2007.
Xu, et al., "Defect-Tolerant Design and Optimization of a Digital Microfluidic Biochip for Protein Crystallization", IEEE Transactions on Computer Aided Design, vol. 29, No. 4, 2010, 552-565.
Xu, et al., "Design and Optimization of a Digital Microfluidic Biochip for Protein Crystallization", Proc. IEEE/ACM International Conference on Computer-Aided Design (ICCAD), Nov. 2008, 297-301.
Xu, et al., "Digital Microfluidic Biochip Design for Protein Crystallization", IEEE-NIH Life Science Systems and Applications Workshop, LISA, Bethesda, MD, Nov. 8-9, 2007, 140-143.
Xu, et al., "Droplet-Trace-Based Array Partitioning and a Pin Assignment Algorithm for the Automated Design of Digital Microfluidic Biochips", CODES, 2006, 112-117.
Xu, et al., "Integrated Droplet Routing in the Synthesis of Microfluidic Biochips", IEEE, 2007, 948-953.
Xu, et al., "Parallel Scan-Like Test and Multiple-Defect Diagnosis for Digital Microfluidic Biochips", IEEE Transactions on Biomedical Circuits and Systems, vol. 1(2), Jun. 2007, 148-158.
Xu, et al., "Parallel Scan-Like Testing and Fault Diagnosis Techniques for Digital Microfluidic Biochips", Proceedings of the 12th IEEE European Test Symposium (ETS), Freiburg, Germany, May 20-24, 2007, 63-68.
Yang, et al., "Manipulation of droplets in microfluidic systems", Trends in Analytical Chemistry, vol. 29, Feb. 2010, 141-157.
Yi, et al., "Channel-to-droplet extractions for on-chip sample preparation", Solid-State Sensor, Actuators and Microsystems Workshop (Hilton Head '06), Hilton Head Island, SC, Jun. 2006, 128-131.
Yi, et al., "Characterization of electrowetting actuation on addressable single-side coplanar electrodes", Journal of Micromechanics and Microengineering, vol. 16., Oct. 2006 http://dx.doi.org/10.1088/0960-1317/16/10/018, published online at stacks.iop.org/JMM/16/2053, Aug. 25, 2006, 2053-2059.
Yi, et al., "EWOD Actuation with Electrode-Free Cover Plate", Digest of Tech. papers, 13th International Conference on Solid-State Sensors, Actuators and Microsystems (Transducers '05), Seoul, Korea, Jun. 5-9, 2005, 89-92.
Yi, et al., "Geometric surface modification of nozzles for complete transfer of liquid drops", Solid-State Sensor, Actuator and Microsystems Workshop, Hilton Head Island, South Carolina, Jun. 6-10, 2004, 164-167.

(56) References Cited

OTHER PUBLICATIONS

Yi, "Soft Printing of Biofluids for Micro-arrays: Concept, Principle, Fabrication, and Demonstration", Ph.D. dissertation, UCLA, 2004.
Yi, et al., "Soft Printing of Droplets Digitized by Electrowetting", Transducers 12th Int'l Conf. on Solid State Sensors, Actuators and Microsystems, Boston, Jun. 8-12, 2003, 1804-1807.
Yi, et al., "Soft Printing of Droplets Pre-Metered by Electrowetting", Sensors and Actuators A: Physical, vol. 114, Jan. 2004, 347-354.
Zeng, et al., "Actuation and Control of Droplets by Using Electrowetting-on-Dielectric", Chin. Phys. Lett., vol. 21(9), 2004, 1851-1854.
Zhao, et al., "Droplet Manipulation and Microparticle Sampling on Perforated Microfilter Membranes", J. Micromech. Microeng., vol. 18, 2008, 1-11.
Zhao, et al., "In-droplet particle separation by travelling wave dielectrophoresis (twDEP) and EWOD", Solid-State Sensor, Actuators and Microsystems Workshop (Hilton Head '06), Hilton Head Island, SC, Jun. 2006, 181-184.
Zhao, et al., "Micro air bubble manipulation by electrowetting on dielectric (EWOD): transporting, splitting, merging and eliminating of bubbles", Lab on a chip, vol. 7, 2007, First published as an Advance Article on the web, Dec. 4, 2006, 273-280.
Zhao, et al., "Microparticle Concentration and Separation byTraveling-Wave Dielectrophoresis (twDEP) for Digital Microfluidics", J. Microelectromechanical Systems, vol. 16, No. 6, Dec. 2007, 1472-1481.
Zhao, et al., "Synchronization of Concurrently-Implemented Fluidic Operations in Pin-Constrained Digital Microfluidic Biochips", VLSI Design, (Best Paper Award), 2010.

* cited by examiner

DROPLET ACTUATOR WITH IMPROVED TOP SUBSTRATE

RELATED PATENT APPLICATIONS

This application claims priority to U.S. Patent Application No. 60/969,757, filed on Sep. 4, 2007, entitled "Improved droplet actuator loading"; and U.S. Patent Application No. 60/980,785, filed on Oct. 18, 2007, entitled "Droplet actuator with improved top plate"; the entire disclosures of which is incorporated herein by reference.

GOVERNMENT INTEREST

This invention was made with government support under NNJ06JD53C awarded by the National Aeronautics and Space Administration of the United States. The United States Government has certain rights in the invention.

FIELD OF THE INVENTION

The invention relates to droplet actuation devices, and in particular to specialized structures for conducting droplet operations.

BACKGROUND

Droplet actuators are used to conduct a wide variety of droplet operations. A droplet actuator typically includes two substrates separated by a gap. The substrates are associated with electrodes for conducting droplet operations. The gap includes a filler fluid that is immiscible with the fluid that is to be manipulated on the droplet actuator. The formation and movement of droplets in the gap is controlled by electrodes for conducting a variety of droplet operations, such as droplet transport and droplet dispensing. At least one of the surfaces is typically made from a transparent material, such as a glass top substrate. Among other things, when glass is used, adding features to the glass, such as openings for loading fluid into the gap, can be complex and expensive. There is a need for alternative droplet actuator structures that are easier and less expensive to manufacture while providing the same or better functionality as glass top substrates.

SUMMARY OF THE INVENTION

The invention provides a modified droplet actuator. The droplet actuator generally includes a base substrate and a top substrate separated to form a gap. One or both substrates, but typically the base substrate, includes electrodes configured for conducting droplet operations in the gap. The top substrate may include a first portion coupled to second portion, where the second portion includes one or more openings establishing a fluid path extending from an exterior of the droplet actuator and into the gap.

The first portion may include a more uniformly planar surface exposed to the gap than the second portion. In some embodiments, the first portion is more transparent than the second portion, or the first portion is transparent and the second portion is not. In one embodiment the first portion is substantially transparent, and the second portion is substantially opaque. In another embodiment, the first portion harder than the second portion. In still another embodiment, the first portion is more thermally stable than the second portion. In yet another embodiment, the first portion is more resistant to damage caused by temperature fluctuation than the second portion.

The invention also provides a droplet actuator including a base substrate and a top substrate separated to form a gap, wherein the base substrate includes electrodes configured for conducting droplet operations in the gap; and the top substrate includes a glass portion coupled to a non-glass portion, where the non-glass portion includes one or more openings establishing a fluid path extending from an exterior of the droplet actuator and into the gap. The non-glass portion may, in some embodiments, include or be manufactured from a plastic or resin portion. In some cases, the non-glass portion includes a frame into which the glass portion is inserted.

The fluid path may be arranged to flow fluid into an actual or virtual reservoir associated with one or more reservoir electrodes associated with the base substrate. The fluid path may be arranged to flow fluid into proximity with one or more of the electrodes.

In some embodiments, the glass portion does not include openings therein. In some embodiments, the non-glass portion overlaps the glass portion, and an aperture is provided in the non-glass portion for providing a sensing path from the gap, through the glass portion, through the aperture to an exterior of the droplet actuator. A fitting may be provided in association with the aperture for fitting a sensor onto the droplet actuator.

In some embodiments, a handle is provided, extending from the glass portion and arranged to facilitate user handling of the droplet actuator. In other embodiments, the non-glass portion further includes a hinged cover arranged to seal the openings when the hinged cover is in a closed position. The cover may include one or more dried reagents associated therewith, such that when fluid is present in one or more of the openings, and the cover is closed, the dried reagents contact the fluid and are combined therewith to form fluid reagents.

In another embodiment, the non-glass portion overlaps the glass portion; and one or more of the openings extends through the non-glass portion, through the glass portion, and into the gap. In some embodiments, the opening extending through the non-glass portion is configured as a fluid reservoir.

The invention also provides a droplet actuator including a base substrate and a top substrate separated to form a gap, wherein the (a) base substrate includes electrodes configured for conducting droplet operations in the gap; and an opening forming a fluid path from an exterior of the droplet actuator into the gap; and (b) the top includes a top substrate electrode arranged opposite the opening such that fluid flowing into the gap through the opening flows into proximity with the top substrate electrode.

The invention also includes methods of loading a fluid onto a droplet actuator. The methods generally include providing a droplet actuator of the invention and loading a fluid through the opening and into the gap.

The invention also includes methods of assembling a droplet actuator of the invention. The methods generally coupling the glass portion to the non-glass portion of the top substrate, and assembling the top substrate with the bottom substrate to form a gap therebetween suitable for conducting droplet operations.

Finally, the invention includes methods of conducting a droplet operation. The methods generally include providing a droplet actuator of the invention; loading a liquid onto the droplet actuator into proximity with one or more electrodes; and using the one or more electrodes to conduct the droplet operation.

Other aspects of the invention will be apparent from the ensuing detailed description of the invention.

DEFINITIONS

As used herein, the following terms have the meanings indicated.

"Activate" with reference to one or more electrodes means effecting a change in the electrical state of the one or more electrodes which results in a droplet operation.

"Droplet" means a volume of liquid on a droplet actuator that is at least partially bounded by filler fluid. For example, a droplet may be completely surrounded by filler fluid or may be bounded by filler fluid and one or more surfaces of the droplet actuator. Droplets may, for example, be aqueous or non-aqueous or may be mixtures or emulsions including aqueous and non-aqueous components. Droplets may take a wide variety of shapes; nonlimiting examples include generally disc shaped, slug shaped, truncated sphere, ellipsoid, spherical, partially compressed sphere, hemispherical, ovoid, cylindrical, and various shapes formed during droplet operations, such as merging or splitting or formed as a result of contact of such shapes with one or more surfaces of a droplet actuator.

"Droplet Actuator" means a device for manipulating droplets. For examples of droplets, see U.S. Pat. No. 6,911,132, entitled "Apparatus for Manipulating Droplets by Electrowetting-Based Techniques," issued on Jun. 28, 2005 to Pamula et al.; U.S. patent application Ser. No. 11/343,284, entitled "Apparatuses and Methods for Manipulating Droplets on a Printed Circuit Board," filed on filed on Jan. 30, 2006; U.S. Pat. No. 6,773,566, entitled "Electrostatic Actuators for Microfluidics and Methods for Using Same," issued on Aug. 10, 2004 and U.S. Pat. No. 6,565,727, entitled "Actuators for Microfluidics Without Moving Parts," issued on Jan. 24, 2000, both to Shenderov et al.; Pollack et al., International Patent Application No. PCT/US2006/047486, entitled "Droplet-Based Biochemistry," filed on Dec. 11, 2006, the disclosures of which are incorporated herein by reference. Methods of the invention may be executed using droplet actuator systems, e.g., as described in International Patent Application No. PCT/US2007/009379, entitled "Droplet manipulation systems," filed on May 9, 2007. In various embodiments, the manipulation of droplets by a droplet actuator may be electrode mediated, e.g., electrowetting mediated or dielectrophoresis mediated.

"Droplet operation" means any manipulation of a droplet on a droplet actuator. A droplet operation may, for example, include: loading a droplet into the droplet actuator; dispensing one or more droplets from a source droplet; splitting, separating or dividing a droplet into two or more droplets; transporting a droplet from one location to another in any direction; merging or combining two or more droplets into a single droplet; diluting a droplet; mixing a droplet; agitating a droplet; deforming a droplet; retaining a droplet in position; incubating a droplet; heating a droplet; vaporizing a droplet; condensing a droplet from a vapor; cooling a droplet; disposing of a droplet; transporting a droplet out of a droplet actuator; other droplet operations described herein; and/or any combination of the foregoing. The terms "merge," "merging," "combine," "combining" and the like are used to describe the creation of one droplet from two or more droplets. It should be understood that when such a term is used in reference to two or more droplets, any combination of droplet operations sufficient to result in the combination of the two or more droplets into one droplet may be used. For example, "merging droplet A with droplet B," can be achieved by transporting droplet A into contact with a stationary droplet B, transporting droplet B into contact with a stationary droplet A, or transporting droplets A and B into contact with each other. The terms "splitting," "separating" and "dividing" are not intended to imply any particular outcome with respect to size of the resulting droplets (i.e., the size of the resulting droplets can be the same or different) or number of resulting droplets (the number of resulting droplets may be 2, 3, 4, 5 or more). The term "mixing" refers to droplet operations which result in more homogenous distribution of one or more components within a droplet. Examples of "loading" droplet operations include microdialysis loading, pressure assisted loading, robotic loading, passive loading, and pipette loading. In various embodiments, the droplet operations may be electrode mediated, e.g., electrowetting mediated or dielectrophoresis mediated.

"Filler fluid" means a fluid associated with a droplet operations substrate of a droplet actuator, which fluid is sufficiently immiscible with a droplet phase to render the droplet phase subject to electrode-mediated droplet operations. The filler fluid may, for example, be a low-viscosity oil, such as silicone oil. Other examples of filler fluids are provided in International Patent Application No. PCT/US2006/047486, entitled, "Droplet-Based Biochemistry," filed on Dec. 11, 2006; and in International Patent Application No. PCT/US2008/072604, entitled "Use of additives for enhancing droplet actuation," filed on Aug. 8, 2008.

The terms "top" and "bottom," when used, e.g., to refer to the top and bottom substrates of the droplet actuator, are used for convenience only; the droplet actuator is generally functional regardless of its position in space.

The terms "top" and "bottom" are used throughout the description with reference to the top and bottom substrates of the droplet actuator for convenience only, since the droplet actuator is functional regardless of its position in space.

When a liquid in any form (e.g., a droplet or a continuous body, whether moving or stationary) is described as being "on", "at", or "over" an electrode, array, matrix or surface, such liquid could be either in direct contact with the electrode/array/matrix/surface, or could be in contact with one or more layers or films that are interposed between the liquid and the electrode/array/matrix/surface.

When a droplet is described as being "on" or "loaded on" a droplet actuator, it should be understood that the droplet is arranged on the droplet actuator in a manner which facilitates using the droplet actuator to conduct one or more droplet operations on the droplet, the droplet is arranged on the droplet actuator in a manner which facilitates sensing of a property of or a signal from the droplet, and/or the droplet has been subjected to a droplet operation on the droplet actuator.

DESCRIPTION

The invention provides a droplet actuator with improved features for loading fluid into the gap. In certain embodiments, the droplet actuator includes a top substrate that combines glass with one or more other materials that are easier to manufacture. Examples of such materials include resins and plastics. One such embodiment includes a top substrate including a glass substrate portion and a plastic portion. The glass substrate portion covers the droplet operations area of the droplet actuator, providing a flat, smooth surface for facilitating effective droplet operations. The plastic portion has one or more openings that provide a fluid path from an exterior locus into the gap of the droplet actuator. The fluid path facilitates loading of fluid into the gap of the droplet actuator.

An alternative embodiment of the invention provides a droplet actuator with one or more openings in the bottom substrate or substrate. Various embodiments of the invention may reduce or eliminate the need to form openings in the glass portion of a droplet actuator, avoiding a complex and costly manufacturing step. Still other embodiments avoid the use of glass altogether.

It should also be noted that in various embodiments, the non-glass portion may include multiple kinds of plastics rather than a glass/non-glass construction. For example, in the various glass/non-glass embodiments, one plastic may be substituted for the glass component and a second plastic may be used for the non-glass components. This approach may be employed to, among other things, take advantage of different optical properties (e.g., opaque for reservoirs/clear over electrodes or over detection zones) mechanical properties (flat, hard, planar, precise over electrodes/cheap, easy to mold or machine for fluid passages into reservoirs) or thermal properties (high T over electrodes for film deposition or PCR/cheaper low T for wells), surface properties and the like. In yet another alternative embodiment, the glass portion may be replaced with or coated with a metal foil and a non-glass material may be provided in regions where fluid passages into the droplet actuator are desired, for ease of manufacture.

7.1 Loading Mechanisms Using a Modified Top Substrate

FIGS. 1A and 1B illustrate a top view and cross-sectional view, respectively, of an embodiment of a droplet actuator 100. FIG. 1B is a cross-sectional view that is taken along line A-A of FIG. 1A.

Droplet actuator 100 includes a top substrate 110 that combines a glass portion with a second material, such as resin or plastic. In one embodiment, the top substrate 110 is formed of a glass substrate 114, the perimeter of which is partially or completely surrounded by a non-glass (e.g., plastic or resin) frame 118. The frame 118 includes one or more openings 122 forming a fluid path from an exterior of the droplet actuator 100 into the gap 132. In some embodiments, one or more of the openings 122 may provide a fluid path extending from the exterior of the droplet actuator 100 into an actual or virtual reservoir associated with one or more reservoir electrodes 134. In other embodiments, one or more of the openings 122 may provide a fluid path that is not aligned with or associated with any electrode or with any specialized electrode, such as a reservoir electrode.

Additionally, droplet actuator 100 includes a bottom substrate 126. The bottom substrate 126 includes an associated arrangement of electrodes 130 for performing droplet operations. Electrodes 130 may, for example, be covered with a hydrophobic insulator to permit manipulation of the liquid by electrowetting. The bottom substrate may also include one or more reservoir electrodes 134 for use in dispensing fluid from the reservoir. Bottom substrate 126 may, for example, be made using printed circuit board (PCB) technology or semiconductor manufacturing technology. Top substrate 110 and bottom substrate 126 are separated from one another to form a gap for conducting droplet operations.

The area of glass substrate 114 of top substrate 110 may be selected to cover the active droplet manipulation area of droplet actuator 100. In one example, the area of glass substrate 114 may substantially cover the arrangement of electrodes 130. The locations of openings 122 of frame 118 may correspond with locations of the one or more reservoir electrodes 134. In one embodiment, one or more reservoir electrodes is positioned at the periphery of glass substrate 114 for drawing a quantity of fluid 138 through the openings 122 into droplet actuator 100, e.g., as shown in FIG. 1B. In another embodiment, one or more reservoir electrodes is positioned at the periphery of glass substrate 114 and overlaps with glass substrate 114 for drawing a quantity of fluid 138 through the openings 122 into droplet actuator 100. Frame 118 may be bonded to the periphery edges of glass substrate 114 using adhesives or may be manufactured to permit glass substrate to be snugly fitted into place.

Glass substrate 114 may be transparent. Ideally, glass substrate 114 is as thin as is practical for providing optimal droplet detection capabilities. Frame 118 may, in some embodiments, be opaque and may be substantially the same thickness or thicker than glass substrate 114. A thick frame 118 may facilitate including fluid reservoirs or wells associated with openings 122 to contain a volume of fluid. Because openings 122 are formed within frame 118, glass substrate 114 may be manufactured without the need for forming openings therein. As a result, the added cost and complexity of forming openings in a glass top substrate may be reduced, preferably entirely avoided. By contrast, the process for forming openings, such as fluid reservoirs 122, in a plastic structure, such as frame 118, may be simple and inexpensive. In one embodiment, the total amount of glass required in the device is minimized by only using glass where the flatness, and optical qualities are required.

Figure 2:
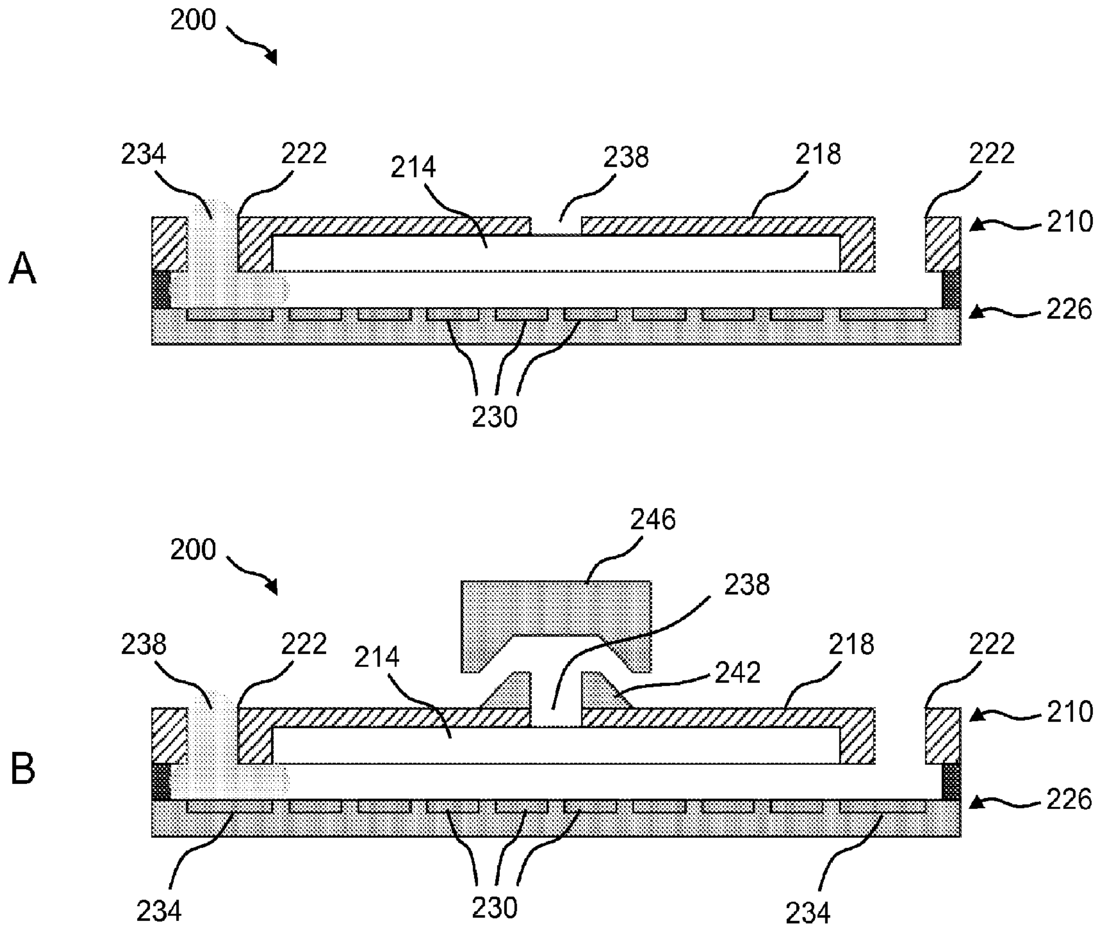

FIG. 2A illustrates a side view of a droplet actuator 200 having generally the same characteristics as droplet actuator 100 shown in FIG. 1. Additionally, in droplet actuator 200, the frame 122 partially overlies the glass substrate 214 forming an overlapping substrate 218 and leaving one or more openings 238 sized to permit detection of droplet characteristics through the glass substrate 214. The locations of the one or more apertures 238 may correspond to detection areas (e.g., certain of the electrodes 230) within droplet actuator 200 where detection is to take place.

FIG. 2B illustrates another side view of a droplet actuator 200 that is described in FIG. 2A. However, FIG. 2B shows the addition of an alignment structure 242 that is coupled to substrate 218 of droplet actuator 200 at aperture 238. Alignment structure 242 may be formed of, for example, molded plastic. In one example, the purpose of alignment structure 242 may be to align aperture 238 of droplet actuator 200 with a corresponding alignment structure 246 associated with an external optical detector 246. The shape of alignment structure 240 may, for example, selected to provide for easy alignment with a cavity of external alignment structure 246.

Figure 3:
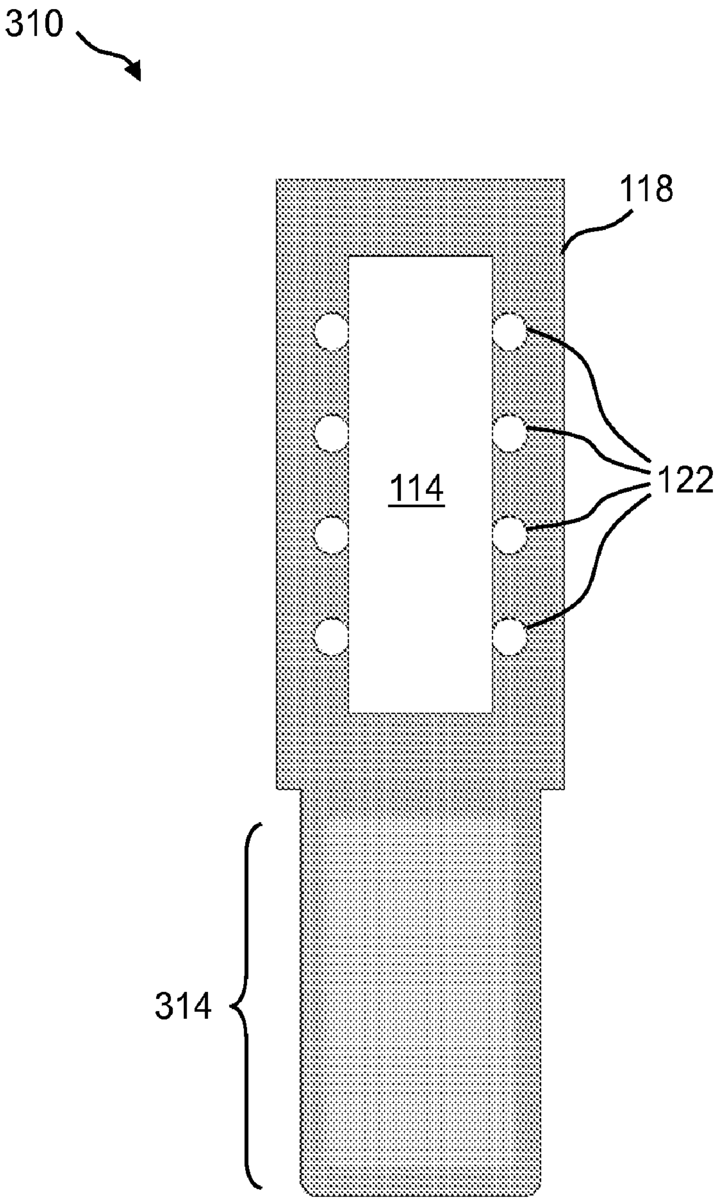

FIG. 3 illustrates a top view of a top substrate 310 that is substantially the same as top substrate 110 of droplet actuator 100 of FIGS. 1A and 1B, except for the addition of a handle 314, which may in some embodiments be molded with the non-glass (e.g., plastic or resin) portions of top substrate 110. Handle 314 may be formed to extend from the main body (i.e., the active droplet operations area) of top substrate 310, in order to facilitate handling of the droplet actuator.

Figure 4:
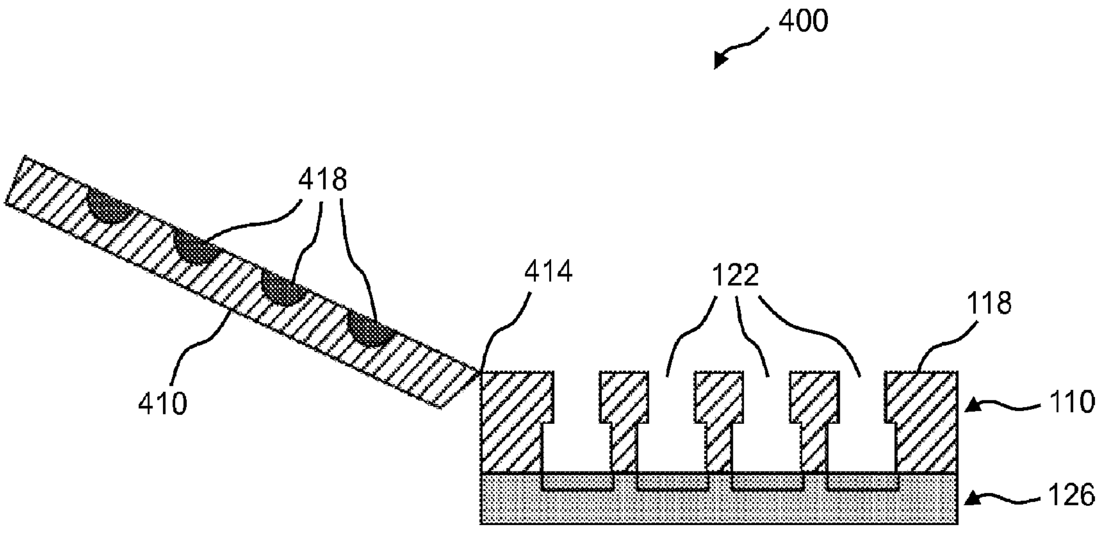

FIG. 4 illustrates a side view of a droplet actuator 400 that is substantially the same as droplet actuator 100 of FIGS. 1A and 1B and/or droplet actuator 200 of FIGS. 2A and 2B, except for the addition of a cover 410. Cover 410 may be attached to frame 118 via a hinge 414, which provides an easy opening and closing mechanism. Optionally, cover 410 may include one or more dried reagents 418 that correspond with openings 122 so that when fluid is included in the reservoirs and cover 410 is closed, the dried reagents are reconstituted in the fluid. Cover 410 may be formed to seal fluid reservoirs 122 when closed. In some embodiments, cover 410 may be molded together with frame 118 as a unitary structure.

7.2 Top Substrate Assemblies

Figure 5:
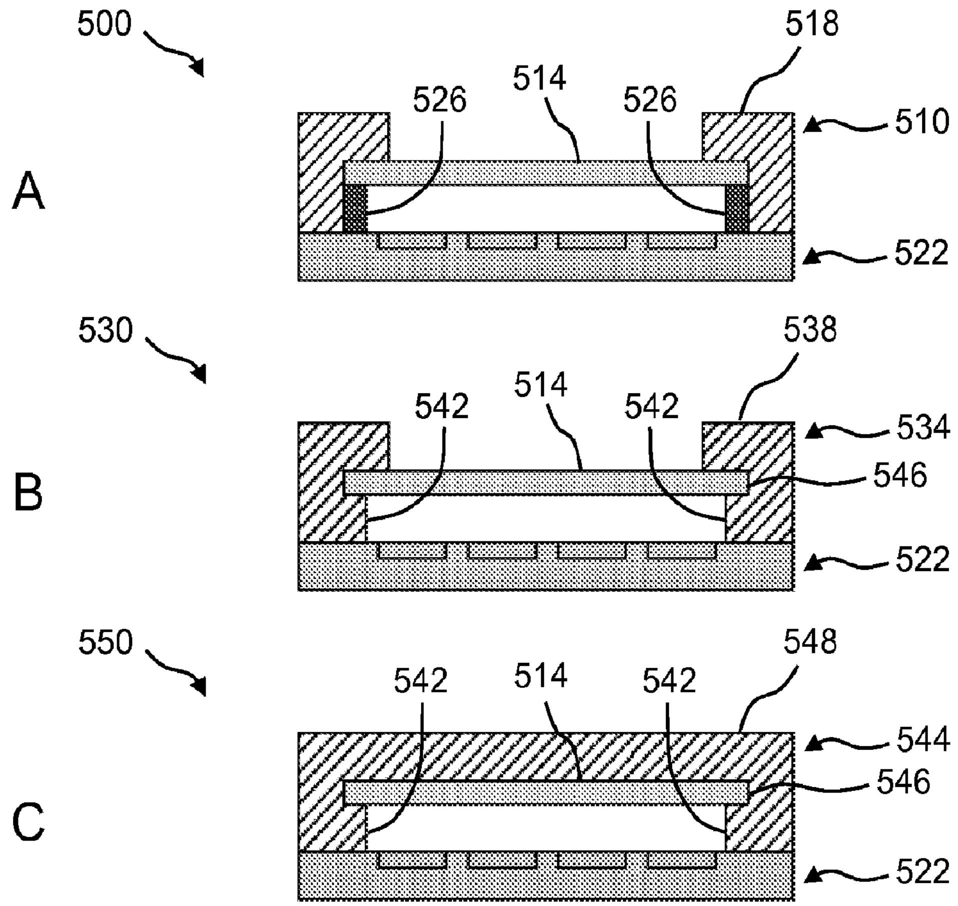

FIGS. 5A, 5B, and 5C illustrate cross-sectional views of droplet actuators that include various embodiments of a loading mechanism that employs a top substrate made from glass and non-glass components.

In one embodiment, FIG. 5A illustrates cross-sectional view of a droplet actuator 500 that includes a top substrate 510 that is formed of a glass substrate 514 and a frame 518. Additionally, droplet actuator 500 includes a bottom substrate 522 that has an associated arrangement of electrodes. Top substrate 510 and bottom substrate 522 are arranged to form a gap for conducting droplet operations. Glass substrate 514 may be substantially the same as glass substrate 114 of droplet actuator 100 of FIGS. 1A and 1B. Similar to frame 118 of droplet actuator 100, frame 518 may include one or more openings (not shown) and a clearance region that corresponds to the active droplet operations area of droplet actuator 500 for fitting a glass substrate, such as glass substrate 514, therein. However, differing from frame 118 of droplet actuator 100, the cross section of frame 518 provides an L-shaped structure, which provides a side wall for surrounding the active droplet operations area of droplet actuator 500 and which also provides a top surface to which glass substrate 514 may abut. Additionally, an arrangement of spacers 526 are provided between glass substrate 514 and bottom substrate 522, in order to support glass substrate 514 against frame 518. When assembled, glass substrate 514, frame 518, and spacers 526 define the gap of droplet actuator 500. The height of the walls of frame 518 and spacers 526 correspond to a desired gap height.

In another embodiment, FIG. 5B illustrates a cross-sectional view of a droplet actuator 530. droplet actuator 530 is substantially the same as droplet actuator 500 of FIG. 5A, except that top substrate 510 is replaced by top substrate 534. Top substrate 534 includes glass substrate 514 of FIG. 5A and a frame 538. Integrated spacers 542, which replace spacers 526 of FIG. 5A, are provided as part of the structure of frame 538. Additionally, the integration of built-in spacers 542 within frame 538 forms a groove 546 into which glass substrate 514 may be installed. Again, the height of built-in spacers 542 corresponds to a desired gap height.

In yet another embodiment, FIG. 5C illustrates a cross-sectional view of a droplet actuator 550. droplet actuator 550 is substantially the same as droplet actuator 530 of FIG. 5B, except that top substrate 534 is replaced by top substrate 544. Top substrate 544 includes glass substrate 514 of FIG. 5A and a substrate 548. Substrate 548 may formed with frame 538, including integrated spacers 542 and groove 546. However, substrate 548 differs from frame 538 in that it does not include the opening. Instead, when installed in groove 546, glass substrate 514 is fully covered by substrate 548. Again, the height of built-in spacers 542 corresponds to a desired gap height.

Referring again to FIGS. 5A, 5B, and 5C, the assemblies may include other features, such as tooling openings, in both the glass and non-glass portions of the top substrate. In one example, the tooling openings may accommodate nuts and bolts for holding the assemblies together.

Figure 6:
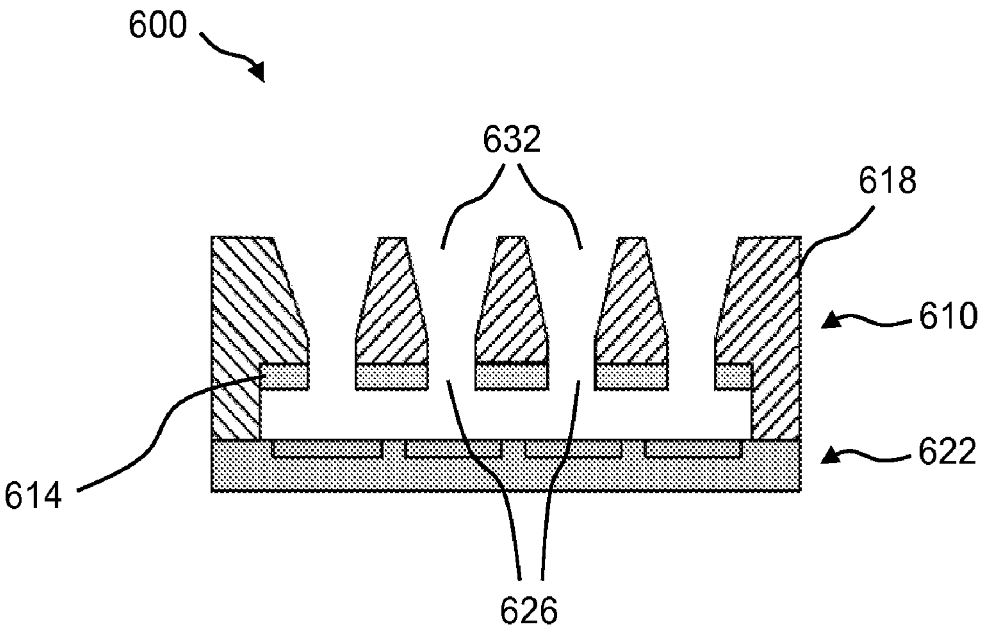

FIG. 6 illustrates a cross-sectional view of a droplet actuator 600 that includes another non-limiting example of a loading mechanism that uses a combination glass and non-glass (e.g., plastic and/or resin) top substrate. Droplet actuator 600 includes a top substrate 610 that is formed of a glass substrate 614 that may be coupled to a non-glass frame 618. Additionally, droplet actuator 600 includes a bottom substrate 622 that includes an associated arrangement of electrodes. Top substrate 610 and bottom substrate 622 are arranged to provide a gap for conducting droplet operations.

Glass substrate 614 further includes one or more openings 626 that correspond to one or more fluid reservoirs 632 within frame 618, as shown in FIG. 6, for the purpose of loading droplet actuator 600. This embodiment includes openings that are formed in both glass substrate 614 and non-glass frame 618, which differs from the embodiments of FIGS. 1A through 5C.

In this embodiment, because of the structural support that is provided by non-glass frame 618, the thickness of glass substrate 614 may be minimized, which allows the glass drilling process to be simplified. In order to facilitate easy loading or to provide reservoirs of larger fluid capacity, fluid reservoirs 632 of frame 618 may be larger than openings 626 of glass substrate 614. Additionally, the walls of fluid reservoirs 632 of frame 618 may have any of a variety of configurations, such as vertical walls or tapered (e.g., to form a conical shape) from a large opening to the smaller openings 626 of glass substrate 614. Forming such shapes in glass would be difficult, but is readily achieved using materials such as plastic or resins. Additionally, frame 618 may be provided having any useful thickness, thereby providing any useful fluid capacity via reservoirs 632.

In yet another embodiment, any of the foregoing embodiments may replace the glass portion with a molded material, such as a plastic or resin. Further, any of the foregoing embodiments may be made as a single plastic or resin component, rather than as glass/non-glass components.

In yet other embodiments, the top substrate may include one or more optical elements formed therein. For example, the optical element may include a lens and/or a diffraction gradient. The optical element may be configured to redirect, or otherwise modify, light to or from a droplet, fluid or surface of a droplet actuator. The optical element may be a modification in a surface of the top substrate or a coating adhered to or layered on a surface of the top substrate.

In one embodiment, the invention provides a top or bottom substrate that includes optical surface patterning. The optical surface patterning may be provided in a glass or non-glass portion of the top or bottom substrate. The top or bottom substrate may itself be glass or a combination of glass/non-glass. The optical surface patterning may, for example, introduce a diffractive optical element to the modified substrate. In one embodiment, the diffractive optical element introduces surface features on the same order of magnitude as the wavelength of light (micrometers or smaller) used for detection purposes. The optical surface patterning may be selected so that diffractive effects dominate refractive effects. In this manner, the microstructure of the optical surface patterning breaks up the light wave in a manner which produces interference patterns. The interference patterns can be evaluated to determine the shape of the output waveform.

7.3 Loading Mechanism in a Bottom Substrate

Figure 7:
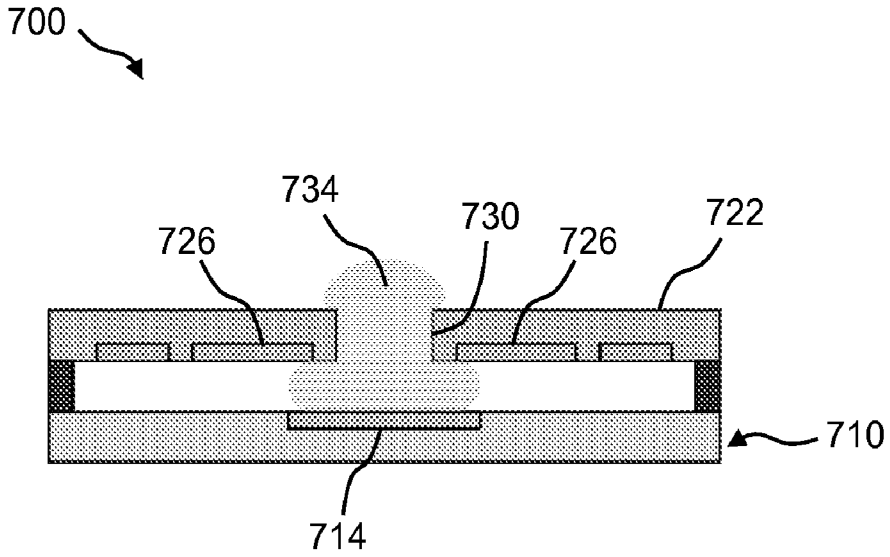

FIG. 7 illustrates cross-sectional view of a droplet actuator 700 that includes a non-limiting example of a loading mechanism in the bottom substrate thereof. Droplet actuator 700 includes a first substrate 710 that includes at least one reservoir electrode 714. Additionally, droplet actuator 700 includes a second substrate 718 that is formed of a substrate 722 that has an associated arrangement of electrodes 726, e.g., electrowetting electrodes, for performing droplet operations. The substrate 722 may, for example, be a PCB substrate. First substrate 710 and second substrate 718 are arranged to form a gap for conducting droplet operations.

In this example, at least one opening 730 is provided in the second substrate, e.g., as shown in FIG. 7. Opening 730 may serve as an inlet for loading the reservoir of droplet actuator 700. When droplet actuator 700 is initally loaded with liquid, the liquid body may not reach the extent of electrodes 726 (and therefoe be manipulated by these electrodes) owing to the fact that the electrodes and inlet are on the same side of substrate 722 and that a certain amount of separation must be maintained between the edge of opening 730 and the edge of electrode 726. This situation can be improved through the use of a reservoir electrode 714 located on the opposite substrate 710 and positioned to substantially align with opening 730. The geometry of reservoir electrode 714 may overlap slightly with the electrodes 726 that are on either side of opening 730 of second substrate 718. Additionally, reservoir electrode 714 is electrically isolated from the ground (not shown).

In operation, droplet actuator 700 may be held in an inverted orientation, such as shown in FIG. 7, and a quantity of fluid 734 may be drawn into droplet actuator 700 via opening 730 within substrate 722 by activating reservoir electrode 714 to bring the liquid into the proximity of electrode 726. Once loaded, reservoir electrode 714 is deactivated and the fine control for performing droplet operations is performed via electrodes 726 of substrate 718. The PCB embodiment of FIG. 7 has the advantage of a low cost, standard process for forming openings and also allows for high precision when forming openings.

7.4 Combined Cartridge/Sample Collection Device

The modified substrates of the invention may also be used to provide sample collection functionality to a droplet actuator cartridge. For example, the top or bottom substrate may be associated with a syringe for sampling a liquid, such as blood or water. The syringe collection chamber may itself serve as liquid reservoir on the top or bottom substrate of the droplet actuator. In this embodiment, the top or bottom substrate includes or is associated with a fluid path from the gap between the substrate into the syringe collection chamber. Liquid from the collection chamber flows through the fluid path into proximity to one or more droplet operations electrodes, where it can be subjected to one or more droplet operations. Other embodiments may include simple sample collection tubes or catheters for introducing liquid from an exterior source into a droplet actuator for analysis.

In another embodiment, the droplet actuator may be configured to serve as a combination forensic sample collection tube and analysis cartridge. Microfluidic analysis can be performed either in the field, e.g., at the point of sample collection, or in a central lab. This configuration provides a quick test result while maintaining the bulk of the sample in pristine condition for further forensic testing. Follow-up testing for evidentiary purposes can then be performed later on the same sample using conventional (i.e., legally-accepted) techniques. In a related embodiment, the droplet actuator includes a break-away sample storage component so that the sample can be preserved in a more compact form.

7.5 Fluids

For examples of fluids that may be subjected to the loading operations and droplet operations using the modified droplet actuators of the invention, see the patents listed in International Patent Application No. PCT/US 06/47486, entitled, “Droplet-Based Biochemistry,” filed on Dec. 11, 2006. In some embodiments, the fluid includes a biological sample, such as whole blood, lymphatic fluid, serum, plasma, sweat, tear, saliva, sputum, cerebrospinal fluid, amniotic fluid, seminal fluid, vaginal excretion, serous fluid, synovial fluid, pericardial fluid, peritoneal fluid, pleural fluid, transudates, exudates, cystic fluid, bile, urine, gastric fluid, intestinal fluid, fecal samples, fluidized tissues, fluidized organisms, biological swabs and biological washes. In some embodiment, the fluid includes a reagent, such as water, deionized water, saline solutions, acidic solutions, basic solutions, detergent solutions and/or buffers. In other embodiments, the fluid includes a reagent, such as a reagent for a biochemical protocol, such as a nucleic acid amplification protocol, an affinity-based assay protocol, a sequencing protocol, and/or a protocol for analyses of biological fluids.

7.6 Method of Making and Loading a Droplet Actuator of the Invention

A method of making a droplet actuator that includes a combination glass/non-glass top substrate includes, but is not limited to, the steps of (1) forming a bottom substrate from, for example, a PCB that includes transport electrodes and also one or more reservoir electrodes at its periphery; (2) forming a glass substrate the corresponds to the active electrowetting area of the bottom substrate of the droplet actuator; (3) forming a non-glass (e.g., plastic or resin) frame or substrate, to which the glass substrate may be coupled, and wherein the frame or substrate includes one or more fluid paths for introducing fluid into the gap; (4) assembling the bottom substrate and top substrate one to another to form the gap. Loading may involve providing a quantity of fluid through the fluid path into the gap. Where the fluid being loaded is a sample or reagent, the fluid may be loaded into proximity with an electrode so that droplet operations may be conducted using the fluid.

The foregoing detailed description of embodiments refers to the accompanying drawings, which illustrate specific embodiments of the invention. Other embodiments having different structures and operations do not depart from the scope of the present invention. This specification is divided into sections for the convenience of the reader only. Headings should not be construed as limiting of the scope of the invention. The definitions are intended as a part of the description of the invention. It will be understood that various details of the present invention may be changed without departing from the scope of the present invention. Furthermore, the foregoing description is for the purpose of illustration only, and not for the purpose of limitation, as the present invention is defined by the claims as set forth hereinafter.

We claim:

1. A droplet actuator comprising a base substrate and a top substrate separated to form a gap, wherein:

(a) the base substrate comprises electrodes configured for conducting droplet operations in the gap;

(b) the top substrate comprises a first substrate portion coupled to a second frame portion, where the second portion comprises one or more openings establishing a fluid path extending from an exterior of the droplet actuator and into the gap, wherein the first substrate portion and second frame portion are not made of the same material; and (c) one or more openings formed in the second frame portion of the top substrate establishing a fluid path extending from an exterior of the droplet actuator and into the gap.

2. The droplet actuator of claim 1 wherein the first substrate portion comprises a more uniformly planar surface exposed to the gap than the second frame portion.

3. The droplet actuator of claim 1 wherein the first substrate portion is more transparent than the second frame portion.

4. The droplet actuator of claim 1 wherein the first substrate portion is transparent, and the second frame portion is opaque.

5. The droplet actuator of claim 1 wherein the first substrate portion is harder than the second frame portion.

6. The droplet actuator of claim 1 wherein the first substrate portion is more thermally stable than the second frame portion.

7. The droplet actuator of claim 1 wherein the first substrate portion is more resistant to damage caused by temperature fluctuation than the second frame portion.

8. The droplet actuator of claim 1 wherein the base substrate comprises a printed circuit board (PCB) substrate.

9. A method of loading a fluid onto a droplet actuator, the method comprising providing a droplet actuator of claim 1 and loading a fluid through the opening and into the gap.

10. A method of conducting a droplet operation, the method comprising:

(a) providing a droplet actuator of claim 1;

(b) loading a liquid onto the droplet actuator into proximity with one or more electrodes; and (c) using the one or more electrodes to conduct the droplet operation.

11. A droplet actuator comprising a base substrate and a top substrate separated to form a gap, wherein:

(a) the base substrate comprises electrodes configured for conducting droplet operations in the gap; and (b) the top substrate comprises a glass substrate portion coupled to a non-glass frame portion, where the non-glass frame portion comprises one or more openings establishing a fluid path extending from an exterior of the droplet actuator and into the gap.

12. The droplet actuator of claim 11 wherein the non-glass frame portion comprises a plastic or resin portion.

13. The droplet actuator of claim 11 wherein the non-glass frame portion comprises a frame into which the glass substrate portion is inserted.

14. The droplet actuator of claim 11 wherein the fluid path is arranged to flow fluid into an actual or virtual reservoir associated with one or more reservoir electrodes associated with the base substrate.

15. The droplet actuator of claim 11 wherein the fluid path is arranged to flow fluid into proximity with one or more of the electrodes.

16. The droplet actuator of claim 11 wherein the glass substrate portion does not include openings therein.

17. The droplet actuator of claim 11 wherein:

(a) the non-glass frame portion overlaps the glass substrate portion, and (b) an aperture is provided in the non-glass frame portion for providing a sensing path from the gap, through the glass substrate portion, through the aperture to an exterior of the droplet actuator.

18. The droplet actuator of claim 17 further comprising a fitting provided in association with the aperture for fitting a sensor onto the droplet actuator.

19. The droplet actuator of claim 17 further comprising a handle extending from the glass substrate portion and arranged to facilitate user handling of the droplet actuator.

20. The droplet actuator of claim 11 wherein the non-glass frame portion further comprises a hinged cover arranged to seal the openings when the hinged cover is in a closed position.

21. The droplet actuator of claim 20 wherein the hinged cover comprises one or more dried reagents associated therewith, such that when fluid is present in one or more of the openings, and the cover is closed, the dried reagents contact the fluid and are combined therewith to form fluid reagents.

22. The droplet actuator of claim 11 wherein:

(a) the non-glass frame portion overlaps the glass substrate portion; and (b) one or more of the openings extends through the non-glass frame portion, through the glass substrate portion, and into the gap.

23. The droplet actuator of claim 22 wherein the opening extending through the non-glass frame portion is configured as a fluid reservoir.

24. A method of assembling the droplet actuator of claim 11, the method comprising:

(a) coupling the glass substrate portion to the non-glass frame portion; and (b) assembling the top substrate with the bottom substrate to form a gap therebetween suitable for conducting droplet operations.

* * * * *